United States Patent
Wuu et al.

(10) Patent No.: US 7,118,930 B1
(45) Date of Patent: Oct. 10, 2006

(54) METHOD FOR MANUFACTURING A LIGHT EMITTING DEVICE

(76) Inventors: Dong-Sing Wuu, No. 50, Alley 30, Lane 107, Mei-Tsun S. Rd., Nan District, Taichung City (TW); Ray-Hua Horng, No. 50, Alley 30, Lane 107, Mei-Tsun S. Road, Nan District, Taichung City (TW)

( * ) Notice: Subject to any disclaimer, the term of this patent is extended or adjusted under 35 U.S.C. 154(b) by 0 days.

(21) Appl. No.: 11/205,213

(22) Filed: Aug. 17, 2005

(51) Int. Cl.
*H01L 21/00* (2006.01)
(52) U.S. Cl. .................. 438/22; 438/459; 438/928; 438/977
(58) Field of Classification Search .......... 438/22, 438/33, 459, 928, 977
See application file for complete search history.

(56) References Cited

U.S. PATENT DOCUMENTS

| | | | |
|---|---|---|---|
| 6,245,596 B1* | 6/2001 | Kosaki et al. | 438/114 |
| 6,723,165 B1* | 4/2004 | Ogawa et al. | 117/95 |
| 6,861,335 B1* | 3/2005 | Ueda | 438/458 |
| 6,967,981 B1* | 11/2005 | Chua et al. | 372/46.01 |
| 7,015,117 B1* | 3/2006 | Urbanek | 438/458 |
| 2004/0245543 A1* | 12/2004 | Yoo | 257/103 |

* cited by examiner

*Primary Examiner*—Trung Dang
(74) *Attorney, Agent, or Firm*—Davidson Berquist Jackson & Gowdey, LLP

(57) ABSTRACT

A method for manufacturing a light emitting device includes (a) preparing a semiconductor element formed with a crystalline substrate, and a temporary element, the temporary element including a laser-transmissive substrate and a laser-dissociable layer formed on the laser-transmissive substrate, (b) attaching the laser-dissociable layer of the temporary element to the epitaxial layer of the semiconductor element through a adhesive layer, (c) thinning the crystalline substrate, (d) applying a laser beam to the temporary element so as to dissociate the laser-dissociable layer of the temporary element, and removing the temporary element from the adhesive layer, and (e) removing the adhesive layer from the epitaxial layer of the semiconductor element.

18 Claims, 5 Drawing Sheets

PREPARING A SEMICONDUCTOR ELEMENT INCLUDING A CRYSTALLINE SUBSTRATE HAVING A TOP SURFACE AND A BOTTOM SURFACE, AND AN EPITAXIAL LAYER FORMED ON THE TOP SURFACE OF THE CRYSTALLINE SUBSTRATE, AND A TEMPORARY ELEMENT INCLUDING A LASER-TRANSMISSIVE SUBSTRATE AND A LASER-DISSOCIABLE LAYER FORMED ON THE LASER-TRANSMISSIVE SUBSTRATE

↓

ATTACHING THE LASER-DISSOCIABLE LAYER OF THE TEMPORARY ELEMENT TO THE EPITAXIAL LAYER OF THE SEMICONDUCTOR ELEMENT THROUGH A FIRST ADHESIVE LAYER

↓

THINNING THE CRYSTALLINE SUBSTRATE FROM THE BOTTOM SURFACE OF THE CRYSTALLINE SUBSTRATE

↓

APPLYING A LASER BEAM TO THE TEMPORARY ELEMENT SO AS TO DISSOCIATE THE LASER-DISSOCIABLE LAYER OF THE TEMPORARY ELEMENT, AND REMOVING THE TEMPORARY ELEMENT FROM THE FIRST ADHESIVE LAYER

↓

REMOVING THE FIRST ADHESIVE LAYER FROM THE EPITAXIAL LAYER OF THE SEMICONDUCTOR ELEMENT

METHOD FOR MANUFACTURING A LIGHT EMITTING DEVICE

BACKGROUND OF THE INVENTION

1. Field of the Invention

This invention relates to a method for making a light emitting device, more particularly to a method for manufacturing a light emitting device involving application of a temporary element having a laser-transmissive substrate and a laser-dissociable layer.

2. Description of the Related Art

Since light emitting diodes have a relatively small size, they have been widely utilized in backlight modules, computers, traffic lights, and outdoor displays.

For a conventional blue light emitting diode, since blue light has a relatively wide energy gap and requires a relatively high exciting energy to bridge the energy gap, the driving current applied to the blue light emitting diode is correspondingly high. Accumulative heat will increase with an increase in current injected into the blue light emitting diode. Therefore, output power of the blue light emitting diode will be reduced due to failure of heat dissipation, and intensity of light emitted by the blue light emitting diode is not satisfactory, accordingly.

Attempts have been made to improve insufficient emitted light intensity of the blue light emitting diode through epitaxial process techniques, chip-processing techniques, and packaging techniques. For the epitaxial process techniques, it has been tried to increase concentrations of donors and acceptors in the light emitting layer, and to decrease dislocation density of the light emitting layer. Nevertheless, it is relatively difficult to increase the concentration of the acceptors in the light emitting layer, particularly in the light emitting layer of GaN system having a relatively wide energy gap. Since there is a relatively high degree of lattice mismatch between sapphire substrate and gallium nitride layer formed on the sapphire substrate in the conventional light emitting diode, it is difficult to make a breakthrough in reducing dislocation density of the active light emitting layer.

Referring to FIG. 1, a conventional blue light emitting diode 1 includes: a sapphire substrate 11 having a top surface 111, and a bottom surface 112 opposite to the top surface 111; a GaN epitaxial layer 12 formed on the top surface 111; a reflective layer 13 formed on the bottom surface 112; an adhesive layer 14 formed on the reflective layer 13; and a Si heat-dissipating substrate 15 attached to the reflective layer 13 through the adhesive layer 14.

The GaN epitaxial layer 12 includes a N-type semiconductor sub-layer 121 having a first region and a second region, a light emitting sub-layer 122 formed on the second region of the N-type semiconductor sub-layer 121, a P-type semiconductor sub-layer 123 formed on the light emitting sub-layer 122, and first and second electrodes 124, 125 formed on the first region of the N-type semiconductor sub-layer 12 and the P-type semiconductor sub-layer 123, respectively.

Particularly, the sapphire substrate 11 is thinned so as to have a thickness ranging from 80 μm to 100 μm.

However, commercially available sapphire substrates suitable for the conventional blue light emitting diode 1 have a relatively low conductivity, and a thickness ranging from 380 μm to 430 μm. Even though such sapphire substrates are thinned to 80 μm to 100 μm in thickness, when used in the blue light emitting diode 1, reduction of output power, which is attributed to excessive accumulative heat generated by a high current injected into the conventional light emitting diode 1, cannot be avoided. Output power of the conventional blue light emitting diode 1 is saturated when the injected current reaches about 75 mA. The output power of the conventional blue light emitting diode 1 cannot be further increased by increasing the current to more than 75 mA, which instead causes the output power to decrease due to excessive accumulative heat.

Therefore, there is still a need in the art to provide a method for improving heat dissipation of the light emitting diode, particularly the blue light emitting diode.

SUMMARY OF THE INVENTION

Therefore, the object of the present invention is to provide a method for manufacturing a light emitting device that can alleviate the aforesaid drawback of the prior art.

According to this invention, a method for manufacturing a light emitting device includes (a) preparing a semiconductor element and a temporary element, the semiconductor element including a crystalline substrate having a top surface and a bottom surface, and an epitaxial layer formed on the top surface of the crystalline substrate, the temporary element including a laser-transmissive substrate and a laser-dissociable layer formed on the laser-transmissive substrate, (b) attaching the laser-dissociable layer of the temporary element to the epitaxial layer of the semiconductor element through an adhesive layer, (c) thinning the crystalline substrate from the bottom surface of the crystalline substrate, (d) applying a laser beam to the temporary element so as to dissociate the laser-dissociable layer of the temporary element, and removing the temporary element from the adhesive layer, and (e) removing the adhesive layer from the epitaxial layer of the semiconductor element.

BRIEF DESCRIPTION OF THE DRAWINGS

Other features and advantages of the present invention will become apparent in the following detailed description of the preferred embodiment of this invention, with reference to the accompanying drawings, in which:

FIG. 2 is a flow chart to illustrate consecutive steps of the preferred embodiment of a method for manufacturing a light emitting device according to this invention;

DETAILED DESCRIPTION OF THE PREFERRED EMBODIMENT

Figure 1:
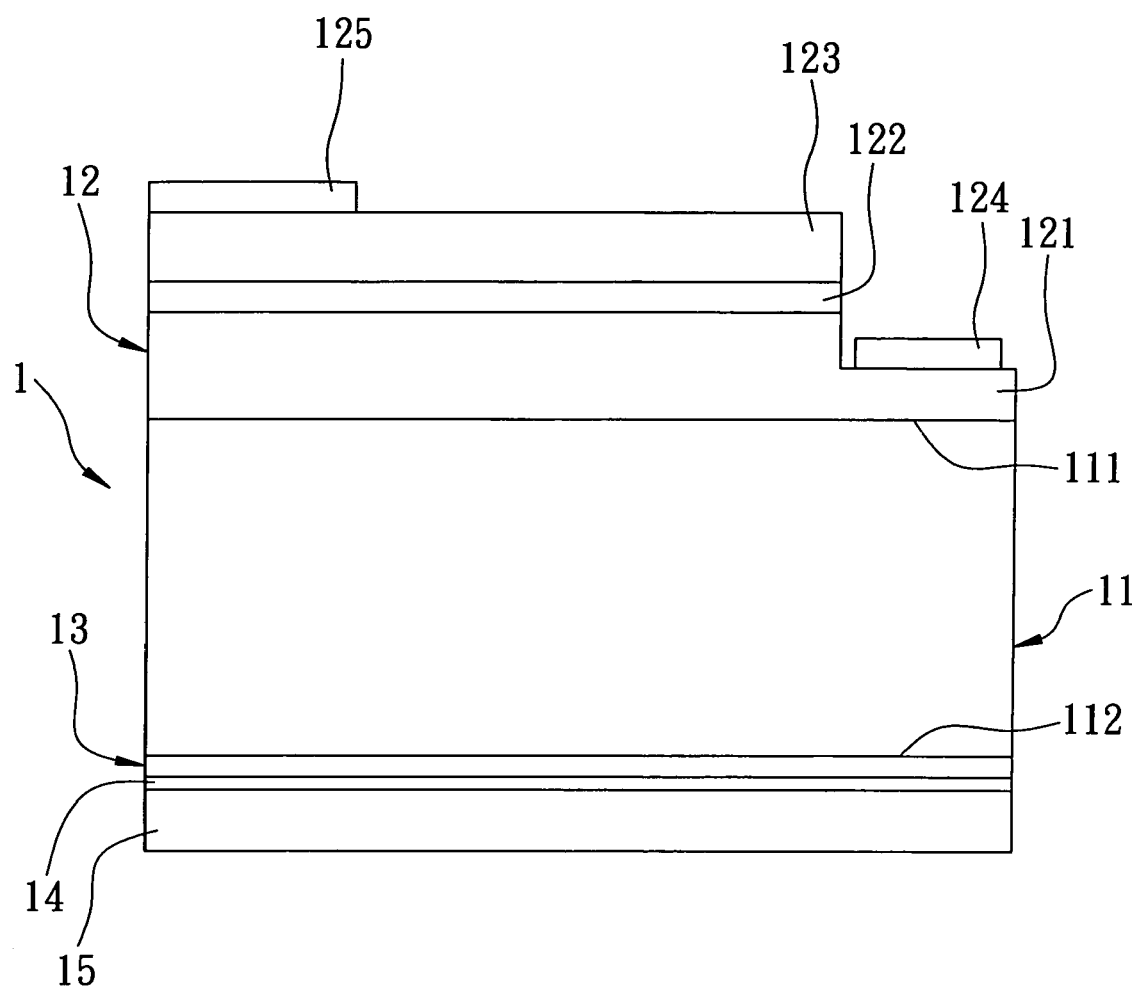
FIG. 1 is a schematic view to illustrate a conventional blue light emitting diode.

FIG. 2 illustrates consecutive steps of the preferred embodiment of the method for manufacturing a light emitting device according to this invention. In the preferred embodiment, the light emitting device is first manufactured by preparing a semiconductor element and a temporary element. The semiconductor element includes a crystalline substrate that has a top surface and a bottom surface, and an epitaxial layer formed on the top surface of the crystalline substrate. Preferably, the crystalline substrate is made from sapphire. The temporary element includes a laser-transmissive substrate and a laser-dissociable layer formed on the laser-transmissive substrate. The laser-dissociable layer of the temporary element is subsequently attached to the epitaxial layer of the semiconductor element through a first adhesive layer. The crystalline substrate is then thinned from the bottom surface of the crystalline substrate using chemical mechanical polishing techniques. Preferably, the crystalline substrate is thinned to have a thickness less than 50 µm. A laser beam is applied to the temporary element so as to dissociate the laser-dissociable layer of the temporary element. The temporary element is then removed from the first adhesive layer. Finally, the first adhesive layer is removed from the epitaxial layer of the semiconductor element.

Preferably, the laser-dissociable layer in the temporary element is made from a material selected from the group consisting of gallium nitride (GaN), indium nitride (InN), indium gallium nitride (InGaN), aluminum gallium nitride (AlGaN), aluminum indium nitride (AlInN), aluminum indium gallium nitride (AlInGaN), zinc oxide (ZnO), indium phosphide (InP), gallium arsenide (GaAs), cadmium arsenide (CdS), and zinc selendide (ZnSe). More preferably, the laser-dissociable layer is made from GaN.

Preferably, the laser-transmissive substrate of the temporary element is made from a material selected from the group consisting of sapphire, quartz, glass, aluminum nitride, silicon carbide, and zinc oxide. More preferably, the laser-transmissive substrate is made from sapphire.

The first adhesive layer may be made from a material selected from the group consisting of spin-on glass (SOG), Au, Sn, Pt, Ag, Al, In, Pb, and Au-containing alloys. Preferably, the first adhesive layer is made from SOG.

Alternatively, the first adhesive layer may include two metal sub-layers differently made from a metal selected from the group of Au, Sn, and Pb. Preferably, the first adhesive layer includes an Au layer and an Sn layer (Au/Sn layers), or a Pb layer and an Sn layer (Pb/Sn layers).

Preferably, the laser beam applied to the temporary element has a wavelength ranging from 190 nm to 550 nm. The laser beam may be generated by a commercial available laser apparatus, such as an excimer laser or a diode-pumped solid state laser. Commercially available excimer lasers can generate a laser beam having a wavelength of 193 nm, 248 nm, 308 nm or 351 nm. Commercially available diode-pumped solid state lasers can generate a laser beam having a wavelength of 266 nm, 355 nm, or 532 nm. The wavelength range of the laser beam required by the preferred embodiment of the method according to this invention can be obtained by finely adjusting the laser apparatus.

Preferably, the preferred embodiment of the method of this invention further comprises attaching a reflective layer to the bottom surface of the crystalline substrate after thinning operation of the crystalline substrate, and subsequently attaching a heat-dissipating substrate to the reflective layer through a second adhesive layer.

The reflective layer may be made from a material selected from the group consisting of Ag, Au, Al, Ti, Pt, In, Pd, and alloys thereof. Alternatively, the reflective layer may include two metal sub-layers made from different metals. Preferably, the reflective layer includes a Ti sub-layer and an Ag sub-layer.

Alternatively, the reflective layer is made from a dielectric layer material including a first dielectric sub-layer and a second dielectric sub-layer having a dielectric constant higher than that of the first dielectric sub-layer. Preferably, the first dielectric sub-layer is made from $TiO_2$, and the second dielectric sub-layer is made from $SiO_2$.

The heat-dissipating substrate may be made from a material selected from the group consisting of Si, Cu, Cu-containing alloys, WMo, MoSi, and WSi. Preferably, the heat-dissipating substrate is made from Si. It is noted that the heat-dissipating substrate is made by Cu-electroplating techniques or Cu-containing alloy-electroplating techniques so as to improve residual strain and durability of the light emitting device including such heat-dissipating substrate.

The second adhesive layer may be made from a material selected from the group consisting of SOG, Au, Sn, Al, Pt, In, Ag, Be and Au-containing alloys. Preferably, the second adhesive layer is made from SOG.

In addition, preferably, the epitaxial layer includes a first-type semiconductor sub-layer that is formed on the top surface of the crystalline substrate, a light emitting sub-layer that is formed on the first-type semiconductor sub-layer, and a second-type semiconductor sub-layer that is formed on the light emitting sub-layer. Preferably, the epitaxial layer is made from a nitride compound containing one element selected from Group IIIB elements, the first-type semiconductor sub-layer is an N-type semiconductor sub-layer, and the second-type semiconductor sub-layer is a P-type semiconductor sub-layer.

The method of this invention further comprises forming first and second electrodes on the N-type and P-type semiconductor sub-layers, respectively. Formation of the first and second electrodes may be carried out through photolithography techniques, during preparation of the semiconductor element or after removing the first adhesive layer.

Figure 3:
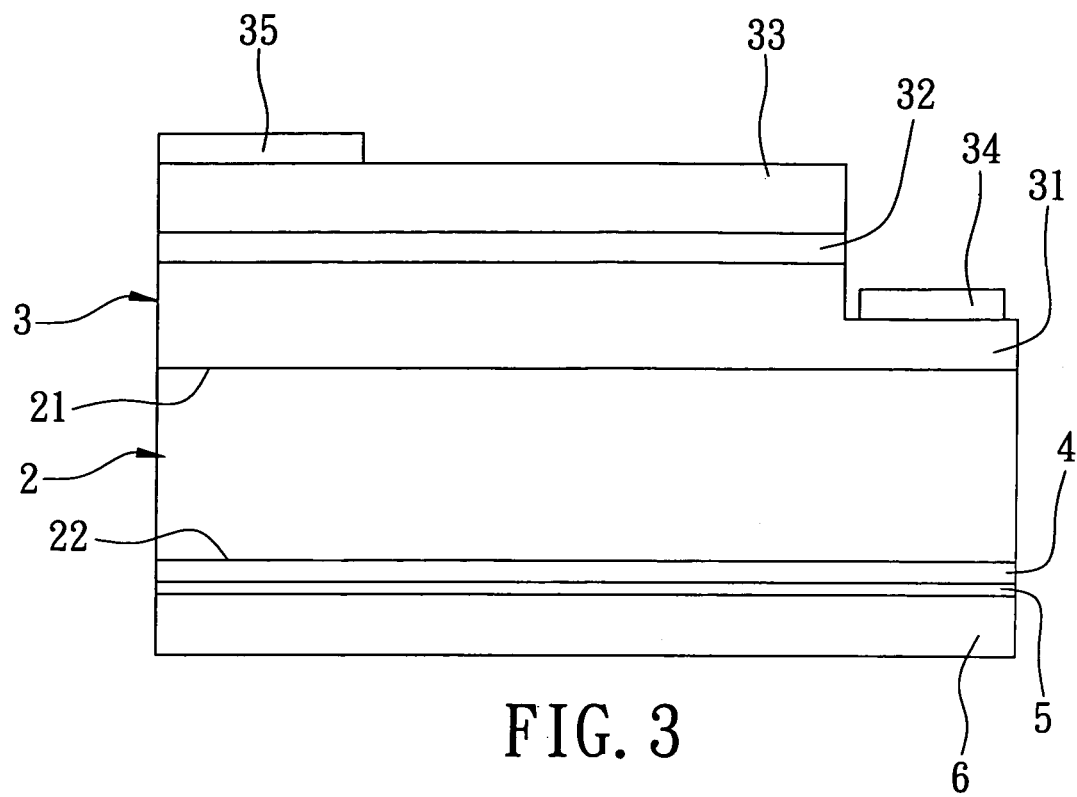
FIG. 3 is a schematic view to illustrate a first example of the light emitting device made according to the preferred embodiment of the method of this invention.

FIG. 3 illustrates a first example of the light emitting device made according to the preferred embodiment of the method of this invention.

The light emitting device of the first example includes a sapphire substrate 2 having a top surface 21 and a bottom surface 22, and a GaN epitaxial layer 3 formed on the top surface 21 of the sapphire substrate 2. The GaN epitaxial layer 3 includes a N-type semiconductor sub-layer 31 formed on the top surface 21 of the sapphire substrate 2, a light emitting sub-layer 32 formed on the N-type semiconductor sub-layer 31, and a P-type semiconductor sub-layer 33 formed on the light emitting sub-layer 32.

In the first example, the sapphire substrate 2 has a thickness of 30 µm.

Figure 4:
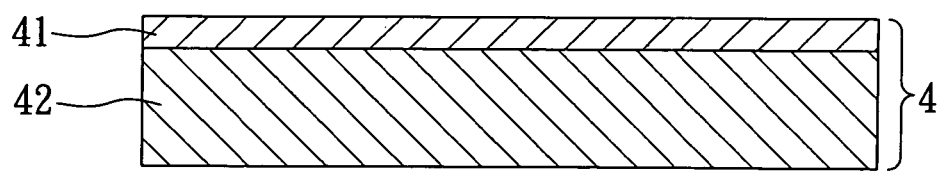
FIG. 4 is a sectional view to illustrate the structure of a reflective layer in the light emitting device of FIG. 3.

A metal reflective layer 4 is attached to the sapphire substrate 2. Referring to FIG. 4, the metal reflective layer 4 includes a Ti sub-layer 41 to be attached to the sapphire substrate 2, and an Ag sub-layer 42 attached to the Ti sub-layer 41. A Si heat-dissipating substrate 6 is attached to the Ag sub-layer 42 of the metal reflective layer 4 through a SOG adhesive layer 5 by thermal-pressure bonding techniques.

First and second electrodes 34, 35 are formed on the N-type and P-type semiconductor sub-layers 31, 33, respectively. The light emitting device thus formed can emit blue light beams having a wavelength ranging from 400 nm to 500 nm.

Figure 5:
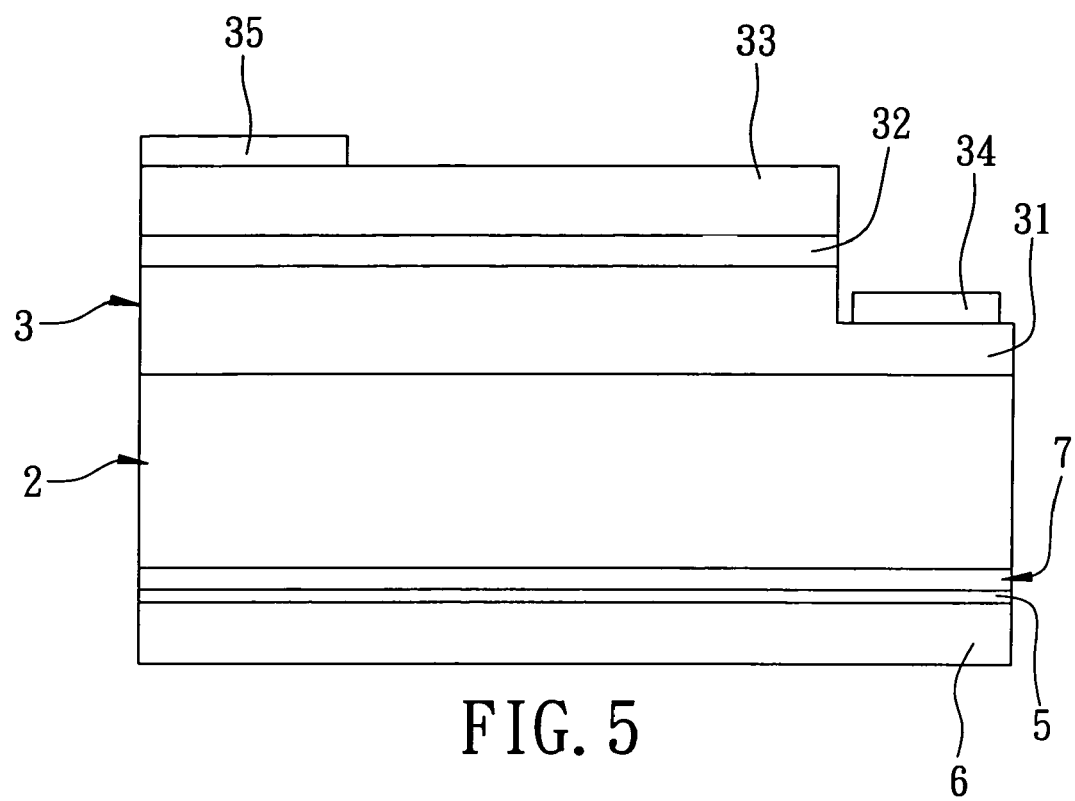
FIG. 5 is a schematic view to illustrate a second example of the light emitting device made according to the preferred embodiment of the method of this invention.
Figure 6:
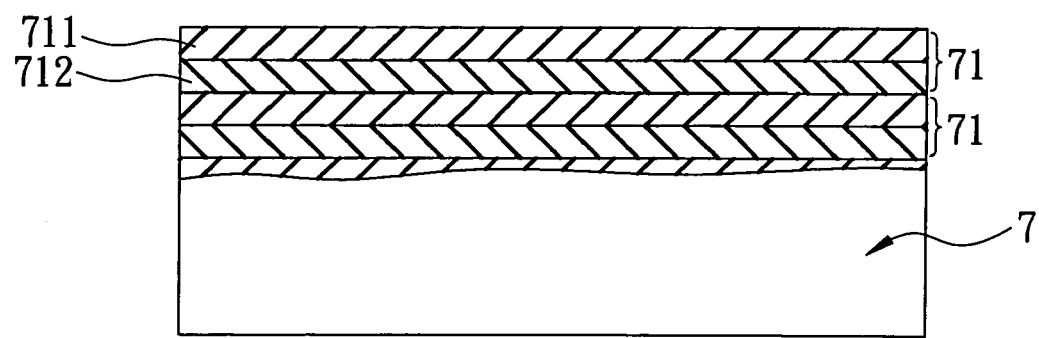
FIG. 6 is a schematic partly sectional view to illustrate the structure of a reflective layer in the light emitting device of FIG. 5.

FIG. 5 illustrates a second example of the light emitting device made according to the preferred embodiment of the method of this invention. The light emitting device of the second example is similar to that of the first example except that a dielectric reflective layer 7 is used in place of the metal reflective layer 4. Referring to FIG. 6, the dielectric reflective layer 7 includes a stack of dielectric layered units 71. Each of the dielectric layered units 71 includes a $TiO_2$ dielectric sub-layer 711 and a $SiO_2$ dielectric sub-layer 712 attached to the $TiO_2$ dielectric sub-layer 711. The $TiO_2$ dielectric sub-layer 711 has a dielectric constant higher than that of the $SiO_2$ dielectric sub-layer 712.

Figure 7:
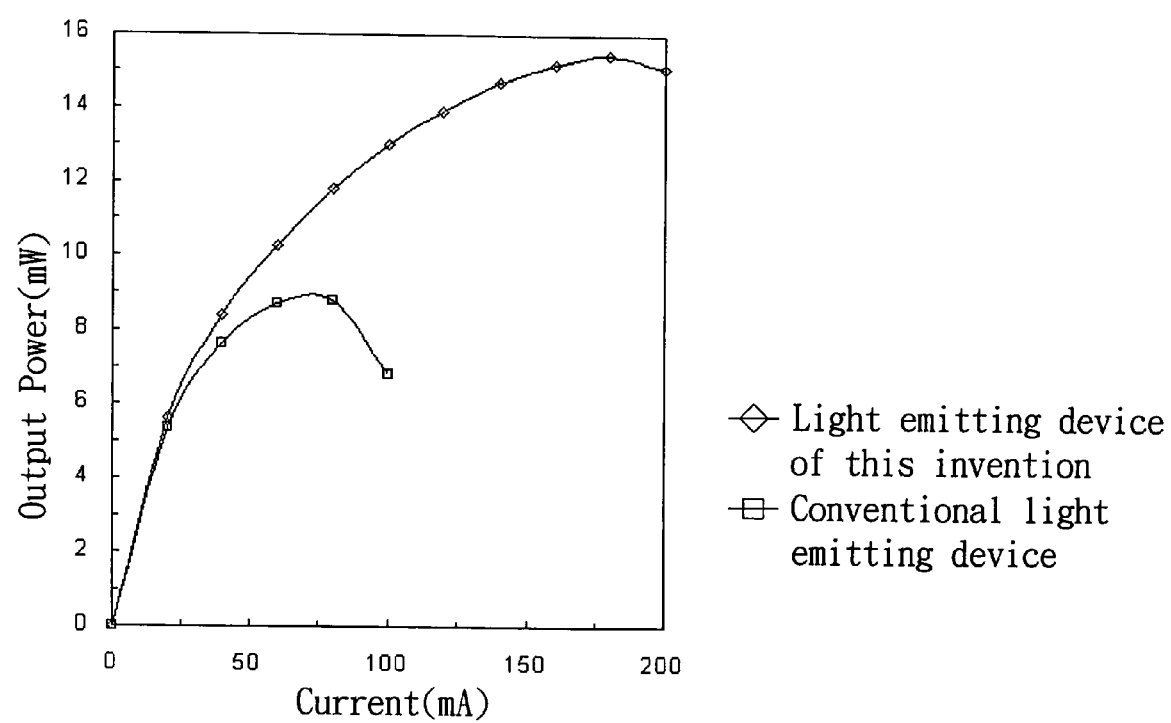
FIG. 7 is a current-output power plot to compare the light emitting device of this invention and the conventional light emitting device in terms of output power.

FIG. 7 illustrates a comparison between the light emitting device made from the method of this invention and the conventional light emitting device in terms of output power. The light emitting device made from the method of this invention is based on the first example of the preferred embodiment as described above, wherein the thickness of the sapphire substrate is 30 μm. The conventional light emitting device has a structure similar to the light emitting device according to this invention except that the thickness of the sapphire substrate of the conventional light emitting device is 90 μm±5 μm. Output power is measured under the following conditions: emitting wavelength: 460 nm, and driving current: 20 mA. The results show that the output power of the light emitting device of this invention, about 15 mW, is much higher than that of the conventional light emitting device, about 9 mW. Apparently, the light emitting device obtained from the method of this invention can reduce accumulative heat attributed to continuous increase in injected current and thus, the output power of the light emitting device can be improved.

It is noted that the emitted light intensity of the light emitting device obtained from the method of this invention can be further improved through arrangements and layout as follows:

1. Formation of a uniform transparent conductive glass layer (such as indium tin oxide) on the P-type semiconductor sub-layer 33 and the second electrode 35 so as to improve distribution of the injected current through the light emitting sub-layer 32 and so as to enhance light extracting efficiency and avoid current crowding.

2. Surface texturing the P-type semiconductor sub-layer 33 so as to increase the critical angle of reflection, thereby improving light extracting efficiency and emitted light intensity of the light emitting device.

3. Providing a current blocking source to the P-type semiconductor sub-layer 33 so as to uniformly distribute the injected current through the light emitting sub-layer 32 and enhance emitted light intensity of the light emitting device.

While the present invention has been described in connection with what is considered the most practical and preferred embodiments, it is understood that this invention is not limited to the disclosed embodiments but is intended to cover various arrangements included within the spirit and scope of the broadest interpretation and equivalent arrangements.

What is claimed is:

1. A method for manufacturing a light emitting device, comprising:
   (a) preparing a semiconductor element and a temporary element, the semiconductor element including a crystalline substrate having a top surface and a bottom surface, and an epitaxial layer formed on the top surface of the crystalline substrate, the temporary element including a laser-transmissive substrate and a laser-dissociable layer formed on the laser-transmissive substrate;
   (b) attaching the laser-dissociable layer of the temporary element to the epitaxial layer of the semiconductor element through a first adhesive layer;
   (c) thinning the crystalline substrate from the bottom surface of the crystalline substrate;
   (d) applying a laser beam to the temporary element so as to dissociate the laser-dissociable layer of the temporary element, and removing the temporary element from the first adhesive layer; and
   (e) removing the first adhesive layer from the epitaxial layer of the semiconductor element.

2. The method as claimed in claim 1, wherein the laser-dissociable layer is made from a material selected from the group consisting of gallium nitride, indium nitride, indium gallium nitride, aluminum gallium nitride, aluminum indium nitride, aluminum indium gallium nitride, zinc oxide, indium phosphide, gallium arsenide, cadmium arsenide, and zinc selendide.

3. The method as claimed in claim 2, wherein the laser-transmissive substrate is made from a material selected from the group consisting of sapphire, quartz, glass, aluminum nitride, silicon carbide, and zinc oxide.

4. The method as claimed in claim 2, wherein the crystalline substrate is made from sapphire.

5. The method as claimed in claim 2, wherein the first adhesive layer is made from a material selected from the group consisting of SOG, Au, Sn, Pt, Ag, Al, In, Pb, and Au-containing alloys thereof.

6. The method as claimed in claim 2, wherein the first adhesive layer includes two metal sub-layers differently made from a metal selected from the group of Au, Sn, and Pb.

7. The method as claimed in claim 2, wherein the laser beam has a wavelength ranging from 190 nm to 550 nm.

8. The method as claimed in claim 2, further comprising attaching a reflective layer to the bottom surface of the crystalline substrate after thinning operation of the crystalline substrate, and subsequently attaching a heat-dissipating substrate to the reflective layer through a second adhesive layer.

9. The method as claimed in claim 8, wherein the reflective layer is made from a material selected from the group consisting of Ag, Au, Al, Ti, Pt, In, Pd, and alloys thereof.

10. The method as claimed in claim 8, wherein the reflective layer includes two metal sub-layers made from different metals.

11. The method as claimed in claim 10, wherein the reflective layer includes a Ti sub-layer and an Ag sub-layer.

12. The method as claimed in claim 8, wherein the reflective layer is made from a dielectric material including a first dielectric sub-layer and a second dielectric sub-layer having a dielectric constant higher than that of the first dielectric sub-layer.

13. The method as claimed in claim 12, wherein the first dielectric sub-layer is made from $TiO_2$, and the second dielectric sub-layer is made from $SiO_2$.

14. The method as claimed in claim 8, wherein the heat-dissipating substrate is made from a material selected from the group consisting of Si, Cu, Cu-containing alloys, WMo, MoSi, and WSi.

15. The method as claimed in claim 8, wherein the second adhesive layer is made from a material selected from the group consisting of SOG, Au, Sn, Al, Pt, In, Ag, Be and Au-containing alloys.

16. The method as claimed in claim 1, wherein the epitaxial layer includes a first-type semiconductor sub-layer that is formed on the top surface of the crystalline substrate, a light emitting sub-layer that is formed on the first-type semiconductor sub-layer, and a second-type semiconductor sub-layer that is formed on the light emitting sub-layer.

17. The method as claimed in claim 16, wherein the epitaxial layer is made from a nitride compound containing one element selected from Group IIIB elements, the first-type semiconductor sub-layer being an N-type semiconductor sub-layer, and the second-type semiconductor sub-layer being a P-type semiconductor sub-layer.

18. The method as claimed in claim 17, further comprising forming first and second electrodes on the first-type and second-type semiconductor sub-layers, respectively.

* * * * *